(12) United States Patent
Tomaru et al.

(10) Patent No.: US 7,003,710 B2
(45) Date of Patent: Feb. 21, 2006

(54) COMMUNICATIONS METHOD, COMMUNICATIONS APPARATUS AND COMMUNICATIONS SYSTEM USING SAME COMMUNICATIONS APPARATUS

(75) Inventors: Tomonobu Tomaru, Tenri (JP); Yoshihiro Ohtani, Kyoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 297 days.

(21) Appl. No.: 09/974,799

(22) Filed: Oct. 12, 2001

(65) Prior Publication Data

US 2002/0046380 A1 Apr. 18, 2002

(30) Foreign Application Priority Data

Oct. 13, 2000 (JP) .............................. 2000-312890
May 14, 2001 (JP) .............................. 2001-142662

(51) Int. Cl.
*H04L 1/14* (2006.01)
*H04L 1/18* (2006.01)
*H03M 13/00* (2006.01)

(52) U.S. Cl. ..................................... 714/751; 714/750
(58) Field of Classification Search ................ 714/750, 714/751, 748, 749
See application file for complete search history.

(56) References Cited

U.S. PATENT DOCUMENTS 5,313,473 A * 5/1994 Darmon et al. ............. 714/751
5,537,416 A * 7/1996 MacDonald et al. ........ 714/748
6,161,207 A * 12/2000 Lockhart et al. ............ 714/758
6,173,431 B1 * 1/2001 Rittle ......................... 714/778
6,359,877 B1 * 3/2002 Rathonyi et al. ........... 370/349
6,421,803 B1 * 7/2002 Persson et al. ............. 714/752
6,604,216 B1 * 8/2003 Javerbring et al. ......... 714/751

FOREIGN PATENT DOCUMENTS

JP 9-247132 9/1997

OTHER PUBLICATIONS

Stephen B. Wicker, Error control Systems for Digital Communication and Storage, Prentice-Hall, 1995, pp. 408-423.*
Daji Qiao et al.: "A Two-Step Adaptive Error Recovery Scheme for Video Transmission Over Wireless Networks" IEEE INFOCOM 2000 PP1698-1704.

* cited by examiner

*Primary Examiner*—Joseph Torres
(74) *Attorney, Agent, or Firm*—Birch, Stewart, Kolasch & Birch, LLP

(57) ABSTRACT

A communications method carries out error-correction encoding of data, generation of a suitable packet in accordance with a retransmission request from a receiving side, and transmission of the packet to the receiving side, from a transmission side. In the receiving side, the communications method performs error-correction decoding of the received data, distinguishing an uncorrectable block in accordance with a result of the error-correction decoding, and transmission of a retransmission request packet to the transmitting side. In this way, if a block in the packet is judged as uncorrectable by the receiving side, where one packet is composed of a plurality of correction blocks of error correction codes of a block type, it is possible to retransmit only the block to be retransmitted. Therefore, it is possible to avoid unnecessary use of bands and to attain a low bit rate.

20 Claims, 18 Drawing Sheets

COMMUNICATIONS METHOD, COMMUNICATIONS APPARATUS AND COMMUNICATIONS SYSTEM USING SAME COMMUNICATIONS APPARATUS

FIELD OF THE INVENTION

The present invention relates to a communications control method, especially to a communications method, a communications apparatus and a communications system using the same communications apparatus, which perform retransmission control so as to improve quality of communication.

BACKGROUND OF THE INVENTION

In general, there are two kinds of error recovery schemes, namely an ARQ (Automatic Retransmission Request) method and an FEC (Forward Error Correction) method. In the ARQ method, a receiving end carries out error detection in accordance with a redundant code that has been added by a transmitting end, so that, in case an error is detected, a retransmission request for a packet, which relating to the error, is transmitted to the transmitting end. Consequently, in the ARQ method, the transmission end retransmits the packet relating to the error. The FEC method carries out error correction at the receiving end referring to the redundant code added by the transmitting end.

Moreover, for example, a hybrid ARQ method, in which the ARQ method and the FEC method are combined, is proposed in "A Two-Step Adaptive Error Recovery Scheme for Video Transmission over Wireless Networks": Daji Qiao and Kang G. Shin, IEEE INFOCOM 2000. In the hybrid ARQ method, the transmission end adds a block error correction code (RS code), while the receiving end carries out error correction in accordance with the information of the RS code. The receiving end transmits a positive ACK signal or a negative ACK signal to the transmitting end, depending on the result of the error correction. The transmitting end retransmits a packet relating to the error when the transmitting end receives the negative ACK signal or when none of the positive and negative ACK signal is received in a time-out interval.

A high bit error rate makes it difficult to achieve an almost-error-free state without carrying out the retransmission, even if an error correction code having high correction ability is used. Therefore, it is necessary in general to have a joint code in which a convolutional code and a block code are combined, or a process such as inter-leave. This increases a size of a circuit and requires a large number of buffers in the transmitting and receiving ends.

Furthermore, in the above literature, the retransmission request is transmitted in case the error cannot be corrected by the error-correction process of the receiving end, and the retransmission is carried out per packet. However, in this method, the length of packet is significantly long (800 to 900 bits) and requires many bands for carrying out the retransmission once.

SUMMARY OF THE INVENTION

The present invention has an object to provide a communications method, communications apparatus, and a communications system using the same communications apparatus which realize efficient communication that requires a smaller number of bands.

To attain the foregoing objects, a communications method of the present invention, which uses a data packet composed of a plurality of blocks so as to communicate, includes steps of (1) transmitting an error correction state of each block from a receiving end to a transmitting end, and (2) retransmitting a block that is not error-corrected (corrected in terms of error) by the receiving end.

With the above communications method, where the error correction status is transmitted per block from the receiving end to the transmitting end, it is possible to retransmit only a part of the data packet, which is uncorrectable as a result of the error correction, instead of the whole data packet, when there is a block that cannot be decoded by the receiving end. Note that, the transmitting end is a side where a station for transmission is located, and the receiving end is a side where a station for receiving is located, with respect to a transmission path.

Moreover, a communications apparatus of the present invention, which uses a data packet composed of a plurality of blocks so as to communicate, and which transmits an error correction state of each block from a receiving end to a transmitting end so that retransmission is performed per block.

Furthermore, a communications system of the present invention is provided with (1) the communications apparatus, in which only an undecodable block is selected out of the data packet that has been received, so that a retransmission request of the undecodable block is transmitted, and (2) the communications apparatus, in which transmits the data packet in such a manner that, in case the communications apparatus receives a retransmission request of a block that is undecodable for the receiving end, a data packet that is to be transmitted next includes the block requested by the retransmission request.

With the above communications system using the communications apparatus, where one data packet is composed of a plurality of correction blocks of error correction codes of a block type, and the retransmission request is transmitted per correction block, it is possible to carries out the retransmission per correction block that is uncorrectable, instead of the retransmission of the whole data packet.

For a fuller understanding of the nature and advantages of the invention, reference should be made to the ensuing detailed description taken in conjunction with the accompanying drawings.

DESCRIPTION OF THE EMBODIMENTS

Explained here in detail are first to fifth embodiments of the present invention, with reference to FIGS. 1 to 18. Note that, hereinafter, denoted as a leaf station (leaf) is a communications apparatus for carrying out retransmission request of a block that forms a data packet, while referred to as a root station (root) is a communications apparatus for transmitting the data packet in which the block, which was requested to be retransmitted, upon receipt of the retransmission request.

[First Embodiment]

Figure 1:
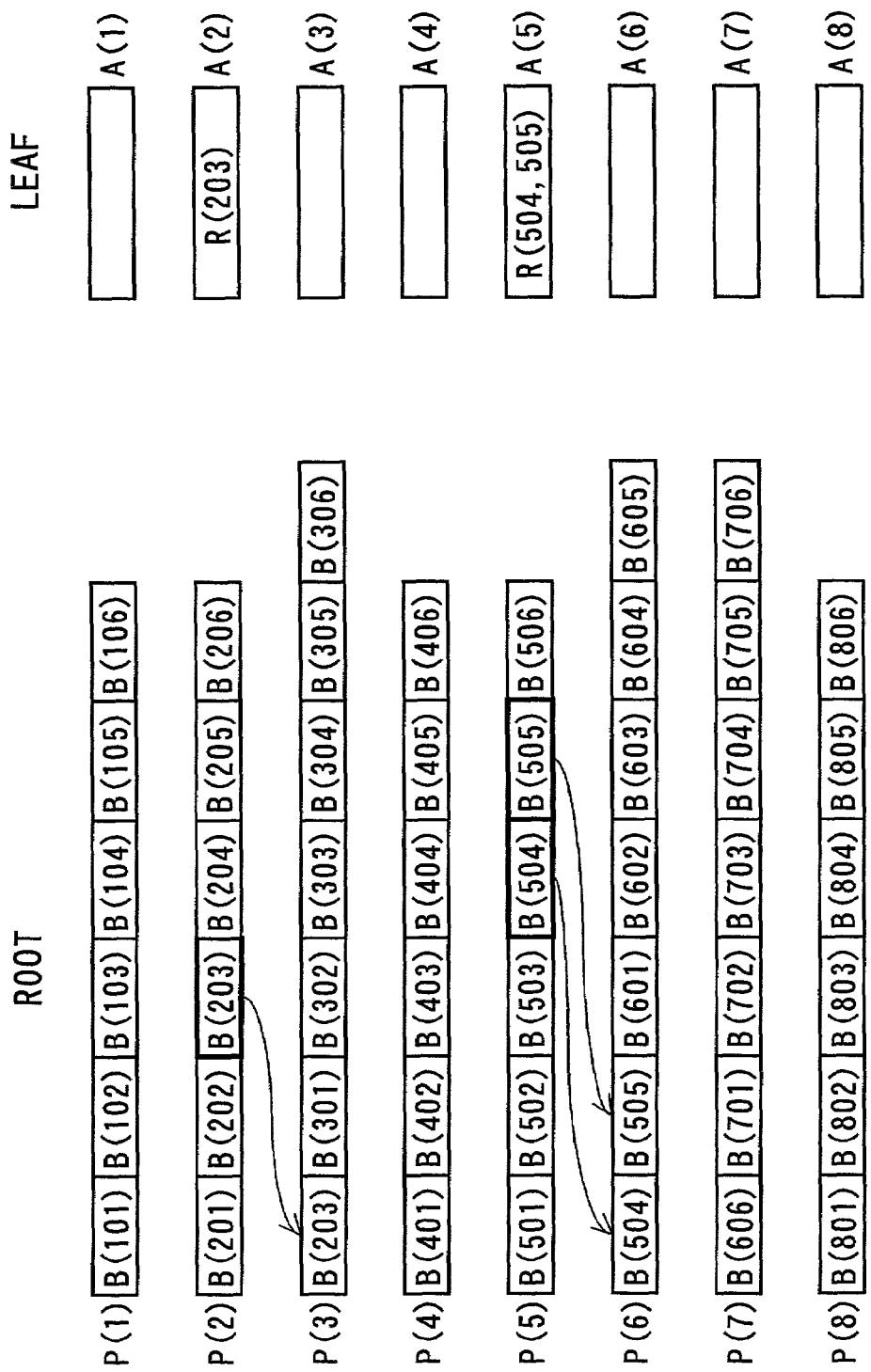
FIG. 1 is an explanatory view illustrating retransmitting control in accordance with a communications method of an embodiment of the present invention.

FIG. 1 is an explanatory view illustrating a retransmission control method of a first embodiment.

It is assumed in the present embodiment that data is transmitted from the root station to the leaf station. Usually, when no error exists, the data packet, which is transmitted from the root station, is composed of a b number of blocks of an error correction codes of block type (in FIG. 1, illustrated is an example where b=6). The root station is provided with a number of bands enough to transmit b+1 number of blocks every time when the data is transmitted. However, a b number of blocks are transmitted when no error exists, thereby saving a remaining one band for retransmission. The leaf station transmits to the root station a retransmission request for an uncorrectable block, in accordance with a result of the error correction as to data which the leaf station has received. When the root station receives the retransmission request from the leaf station, the root station retransmits the block requested by the leaf station. When the root station receives no ACK packet from the leaf station, the root station may regard that all the blocks of the data packet, which has been transmitted just before, were not transmitted so as to prepare for retransmission, or may consider that all the blocks of the data packet are normally transmitted, so as to transmit a next packet.

In FIG. 1, P(1) is a transmission data packet, which is composed of six blocks, namely B(101) to B (106). Note that, for the sake of simplification, no part other than data parts, such as a physical layer header, is illustrated. In reality, however, all of data packets P(1) through A(8) are provided with a physical layer preamble and a header and the like.

In FIG. 1, the transmission data packet(1) is received and subjected to an error-correction process by the leaf station. In this case, it is judged that the reception was normal. Here, an empty retransmission request packet A(1) is transmitted to the root station, so as to acknowledge the normal reception and to inform the root station that the transmission data packet P(1) has been normally received. Then, the root station transmits the transmission data packet P(2) in a next cycle.

Next, illustrated is a case where the transmission data packet P(2) is received and subjected to the error correction by the leaf station, and it is judged that a third block, namely a block B(203) is uncorrectable. In this case, the leaf station transmits a retransmission request packet A (2) which includes a retransmission request for the block B(203). The root station adds the block B(203) into the transmission data packet P(3) in such a manner that the block B(203) is at a head with respect to the blocks B(301) to B(306) that are to be transmitted in this cycle. In short, the transmission data packet P(3), which is composed of seven blocks in total, is transmitted.

In the same fashion, the leaf stations transmits the retransmission request packets A(3) and A(4), while the root station transmits the transmission data packets P(4) and P(5). The transmission data packet P(5) is received and subjected to the error correction by the leaf station. As a result, it is judged that blocks B(504) and B(505) are uncorrectable. In this case, the retransmission request packet A(5) including a retransmission request for blocks B(504) and B(505) is transmitted.

In response to the retransmission request packet A(5), the root station prepares a transmission data packet P(6) with seven blocks, namely the blocks B(504) and B(505), and blocks B(601) to B(605). In short, originally, the six blocks namely, B(601) to B(605) and B(606) are supposed to be transmitted at this time. However, because the retransmission request from the leaf station has priority, the block B(606) is not transmitted at this time, but is inserted in a next transmission data packet P(7) and transmitted. Therefore, the transmission data packet P(7) is composed of seven blocks namely, the block B(606), and blocks B(701) to B(706).

As for FIG. 1, if the root station periodically generates the data packets, it may be so arranged that the leaf station transmits to the root station the retransmission request packet when the leaf station receives no data packet by an arrival time for the data packet.

Figure 2:
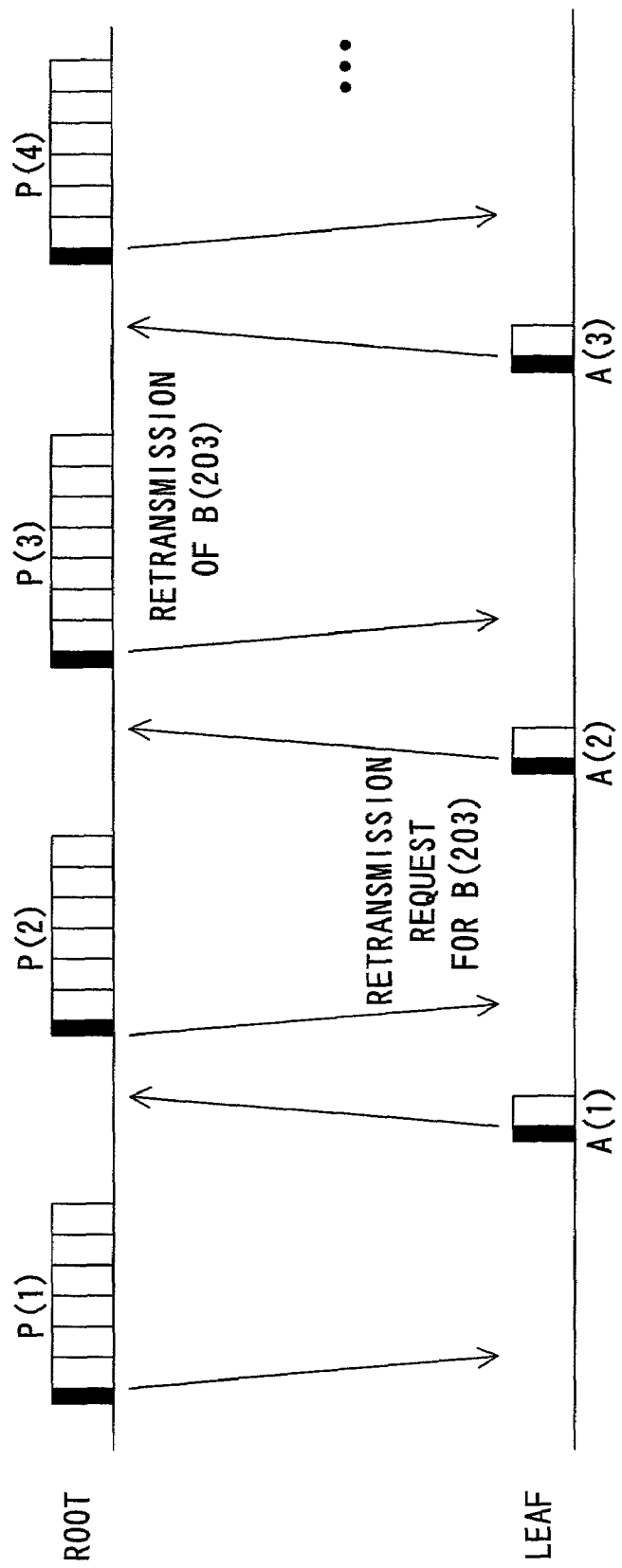
FIG. 2 is a timing chart for operations of a communications system of the communications method shown in FIG. 1.

FIG. 2 is a timing chart of the retransmission shown in FIG. 1. Therefore, transmission data packets P(1) to P(4) and A(1) through A(3) in FIG. 2 correspond to the respective packets in FIG. 1. Moreover, a black section at a head of each pack indicates a physical layer preamble and a header.

As shown in FIG. 2, firstly, the root station transmits the transmission data packet P(1). The transmission data packet P(1) is received and subjected to the error correction by the leaf station. In the present embodiment, the transmission data packet P(1) is normally corrected by the leaf station, so that the leaf station transmits the retransmission request packet A(1) that indicates the normal reception of the transmission data packet P(1). The root station receives and analyzes the retransmission request packet A(1), thereby being informed that the transmission data packet P(1) has been normally received. Thus, the root station transmits the transmission data packet P(2) in the next cycle. The leaf station receives the transmission data packet P(2) and carries out the error correction of the transmission data packet P(2).

In the present embodiment, the block B(203) in the transmission data packet P(2) is uncorrectable. In this case, the retransmission request packet A(2), which includes the retransmission request for the block B(203), is transmitted. The root station receives and analyzes the retransmission request packet A(2), so as to be informed that there is an uncorrectable block in the transmission data packet P(2). As a result, the root station transmits in the next cycle the transmission data packet P(3) in which the block B(203) is inserted to be at a head of the transmission data packet P(3).

Next, in the same way, the leaf station transmits the retransmission request packet A(3), and the root station transmits the transmission data packet P(4), and the communication is continued in the same fashion after that.

Figure 3:
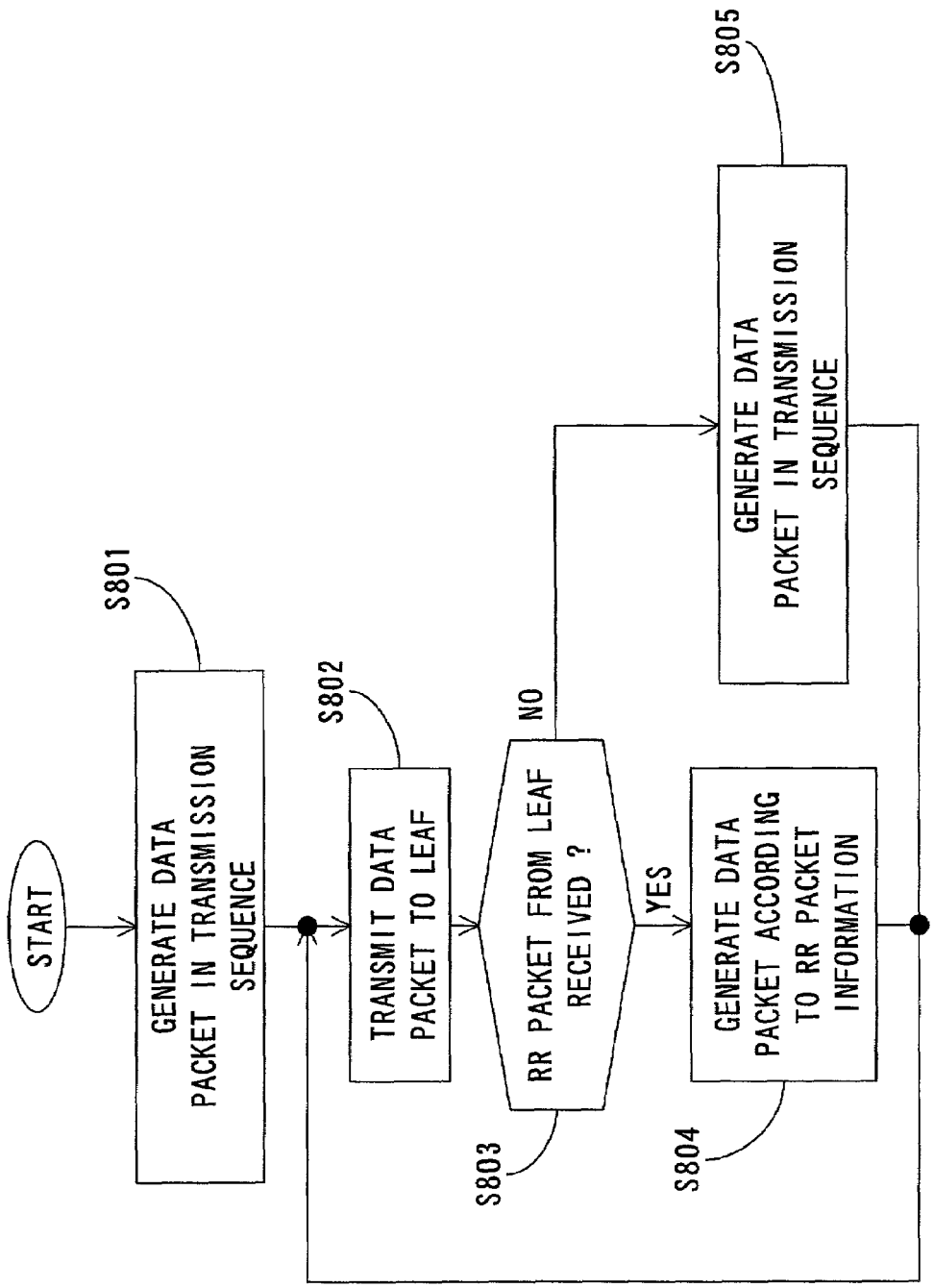
FIG. 3 is a flow chart for operation of a root station of the communications system of the communications method shown in FIG. 1.

FIG. 3 is a flow chart illustrating the operation of the root station of the embodiment shown in FIG. 1.

As shown in FIG. 3, the root station generates a first data packet (S801). Then, the root station transmits the thus generated data packet to the leaf station (S802), and waits for a retransmission request packet from the leaf station (S803). Here, when the retransmission request packet is received from the leaf station within a predetermined period of time, it moves to a step S804. If no retransmission request packet is received, it moves to a step S805.

In the step S804, which is for the case where the retransmission request is received from the leaf station, a data packet to be transmitted in a next cycle is generated in accordance with information in the received retransmission request. After the generation of the data packet in the step S804, it moves to the step S802 so as to transmit the data packet.

On the other hand, the step S805 is for the case where no retransmission request packet is received from the leaf station. In this case, the root station judges that the data packet just before was normally received by the leaf station, and does not carry out retransmission but generates a next data packet. After the generation of the next data packet, it moves to the step S802, so as to transmit the data packet to the leaf station.

Moreover, in FIG. 3, illustrated is the case where no retransmission is carried out in the step S805. However, it may be so arranged that it is judged that the transmission data packet just before is not received by the leaf station, so as to generate the next data packet in such a manner that all the blocks in the transmission data packet just before are retransmitted.

Figure 4:
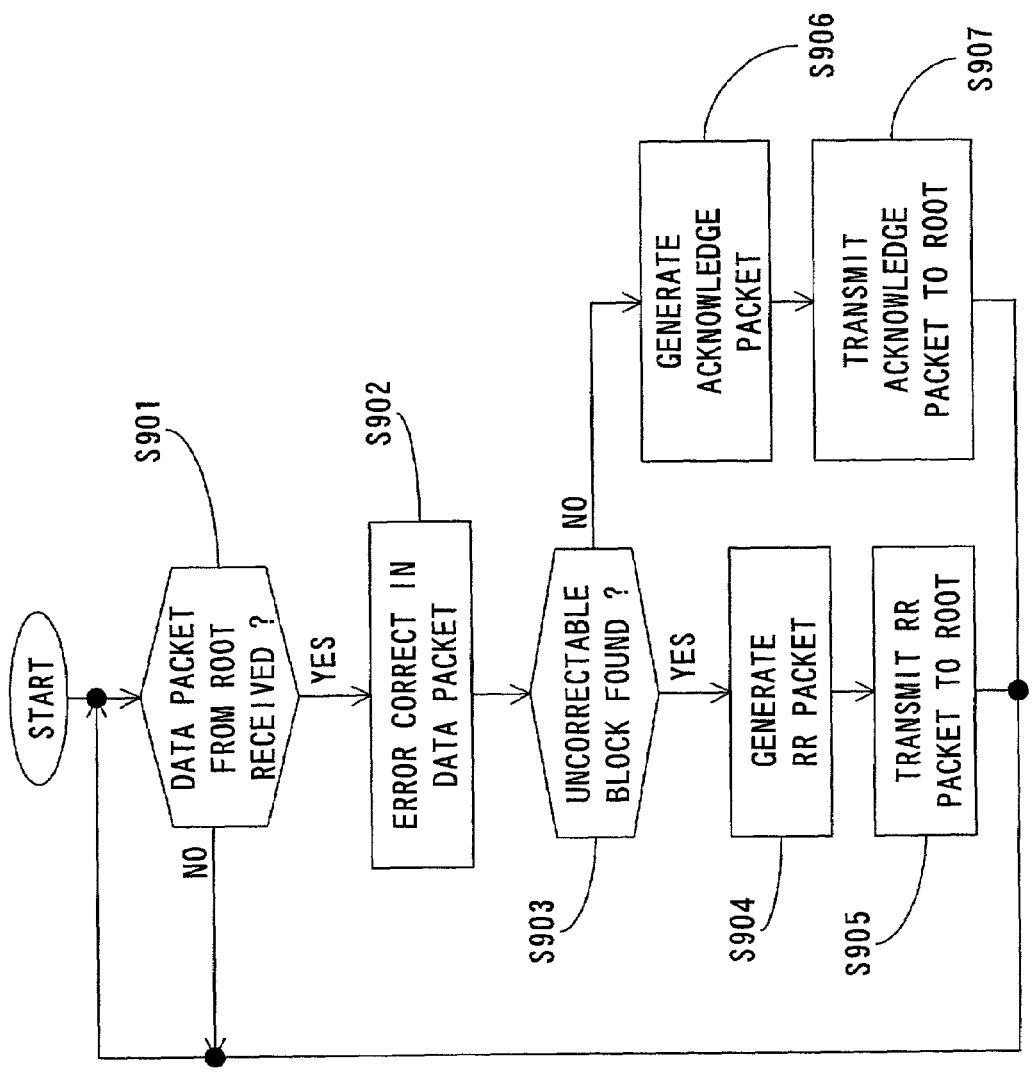
FIG. 4 is a flow chart for operation of a leaf station of the communications system of the communications method shown in FIG. 1.

FIG. 4 is a flow chart illustrating the operation of the leaf station shown in FIG. 1.

As shown in FIG. 4, a step S901 is a wait state for a transmission data packet from the root station. Upon receipt of the transmission data packet from the root station, error correction process is carried out for the received data (S902), so as to judge whether an uncorrectable block exists in the received data (S903). If an uncorrectable block is found at the step S903, a retransmission request packet for the uncorrectable block is generated (S904) and is transmitted to the root station (S905). On the other hand, if no uncorrectable block is found at the step S903, an empty retransmission request packet (in the figures, referred to as an acknowledge (ACK) packet) for indicating the normal reception of the transmission data packet is generated (S906), and is transmitted to the root station (S907). After the transmission of the retransmission request packet at the steps S905 or at the step S907, it moves to the step S901 to be in the wait state for the transmission data packet from the root station.

Figure 5:
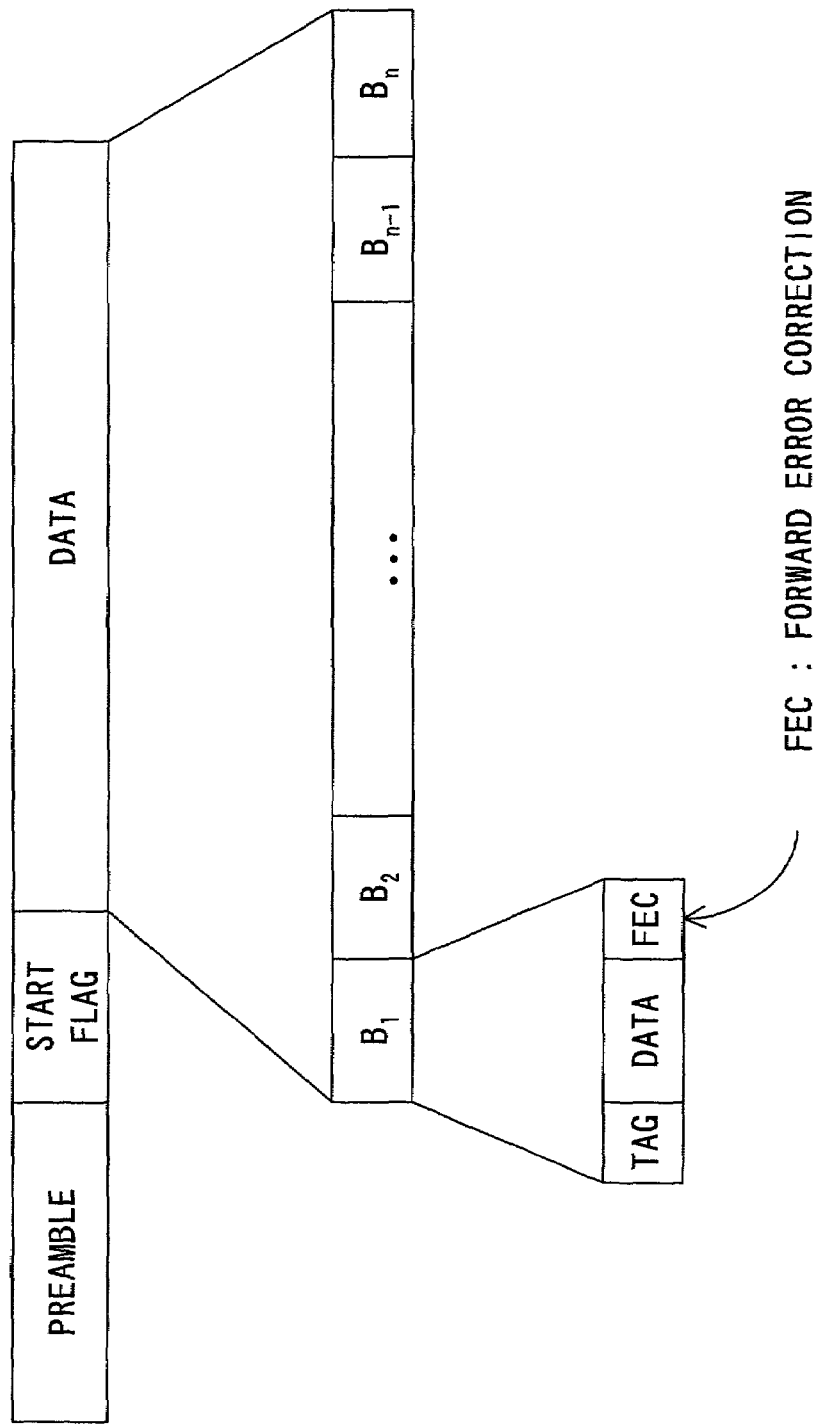
FIG. 5 is an explanatory view showing an example of a packet format of a transmission data packet of the communications method shown in FIG. 1.

Here, FIG. 5 is an explanatory view illustrating an example of a packet format of the transmission data packet for use in the present invention.

As shown in FIG. 5, the transmission data packet is composed of a physical layer preamble part, a physical layer header part and a data part. The data part is further composed of an n number of blocks. Each block includes an error detecting code, and tag information, which includes retransmission sequence information for each block and identifier for indicating the retransmission block. The retransmission sequence information may be a sequence for each block or a combination of packet numbers and block numbers, for example. Moreover, while the tag information is given to each block in FIG. 5, it may be so arranged, for example, that a head of the data part includes all pieces of the tag information for the blocks, because the tag information need not be included in each block.

Figure 6:
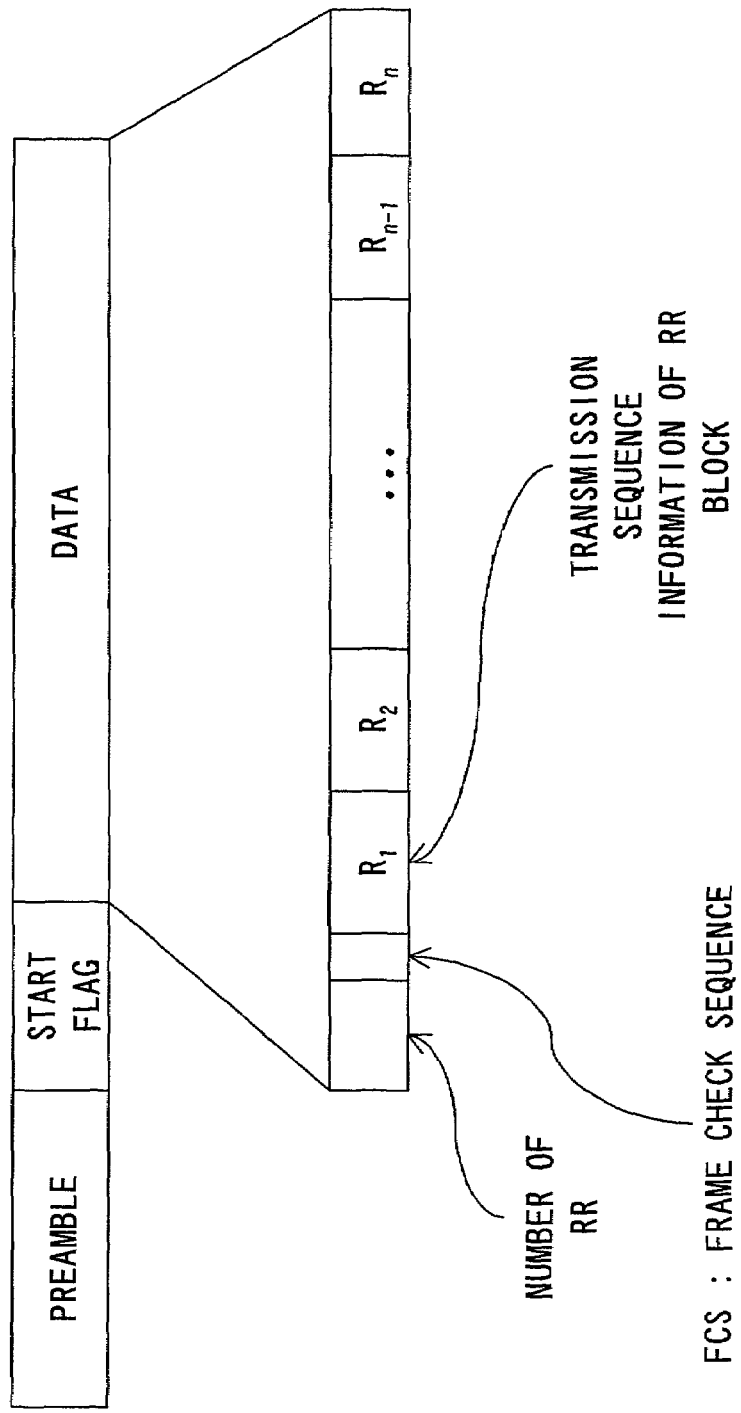
FIG. 6 is an explanatory view showing an example of a packet format of a retransmission request packet of the communications method shown in FIG. 1.
Figure 7:
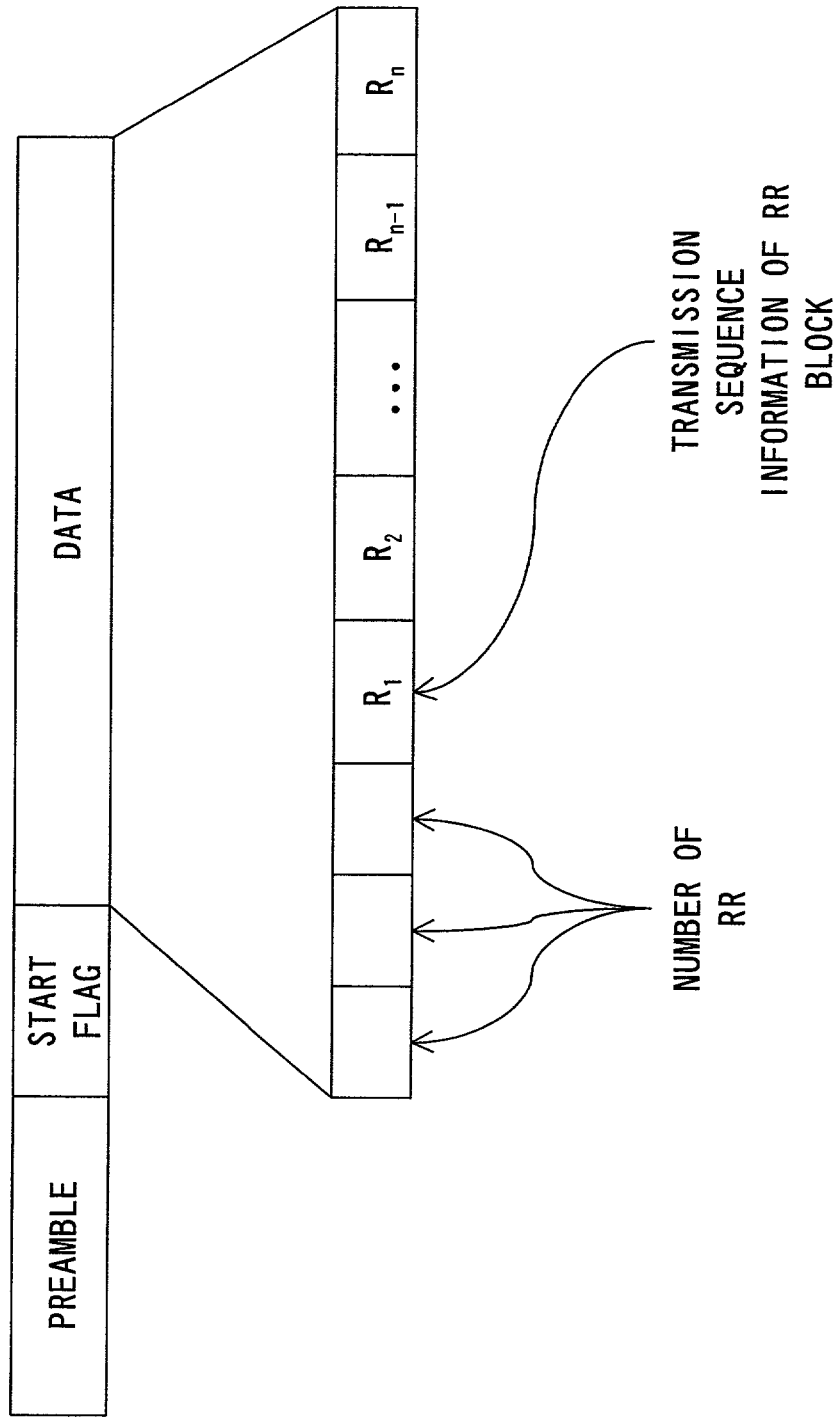
FIG. 7 is an explanatory view showing an another example of a packet format of a retransmission request packet of the communications method shown in FIG. 1.

Moreover, FIGS. 6 and 7 are explanatory views illustrating examples of packet formats of retransmission request packets for use in the present invention.

As shown in FIG. 6, the packet format of the retransmission request packet is composed of a physical layer preamble part, a physical layer hear part and a data part, as in FIG. 5. The data part includes transmission sequence information for the retransmission request packet to be retransmitted. The root station carries out the retransmission in accordance with the transmission sequence information. In addition, the data part of the retransmission request packet may not be subjected to the error correction, or error detection code or error correction code may be used. Moreover, as shown in FIG. 7, it may be so arranged that the retransmission request packet includes a plurality of pieces of information that indicate how many blocks are required to be retransmitted (retransmission requesting number information). This makes it possible to refer to other retransmission requesting number information even if a part of the retransmission requesting number information is erroneous, so as to determine the retransmission requesting number information in accordance with a majority rule. Therefore, this makes the retransmission requesting number information, which is important, more tolerate against an error.

Figure 8:
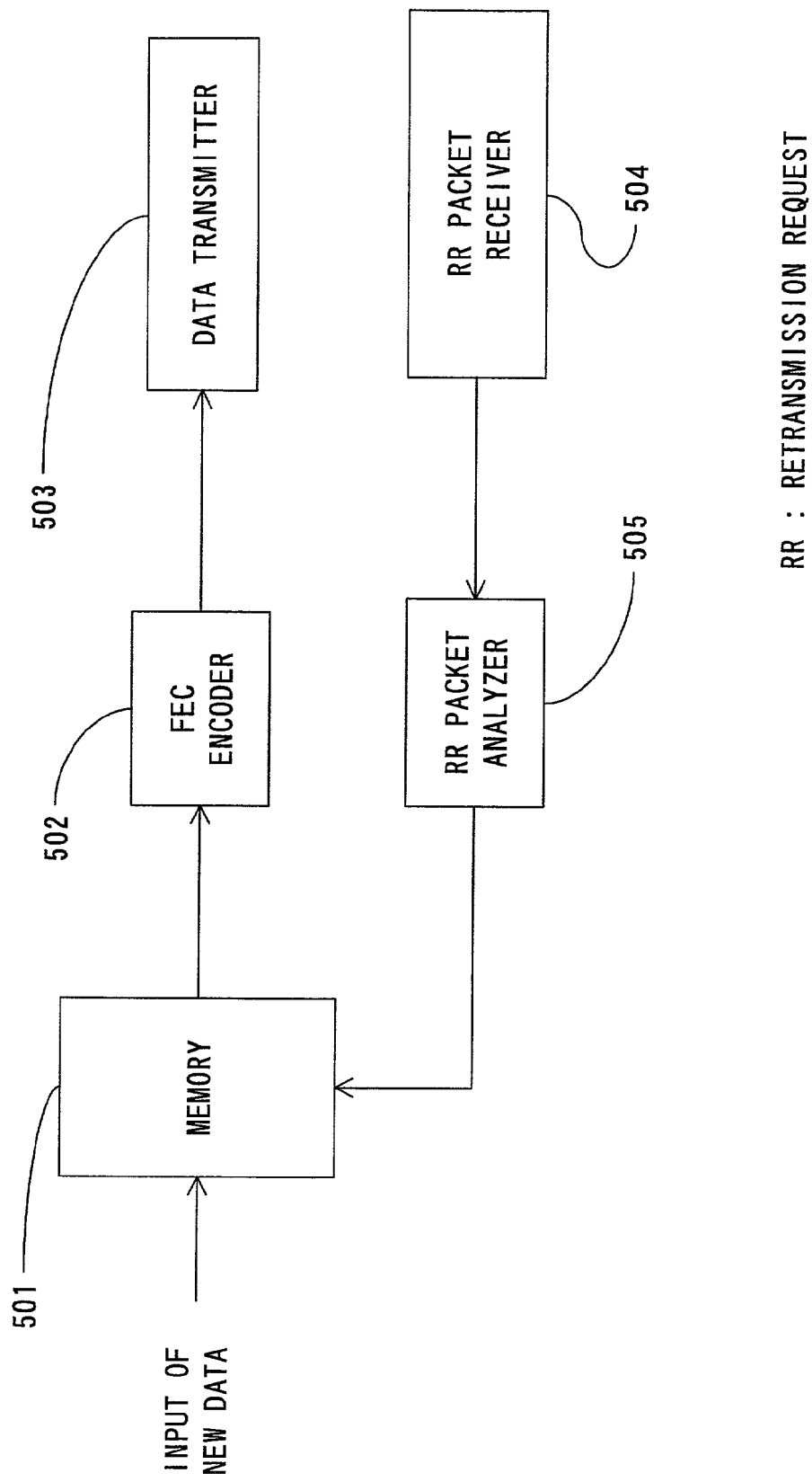
FIG. 8 is a block diagram illustrating an inner arrangement of the root station of the communications system of the communications method shown in FIG. 1.

FIG. 8 is a block diagram illustrating the root station used in the embodiments of the present invention. A memory 501 stores inputted data for a predetermined period, and outputs transmission data in accordance with information from a retransmission request packet analyzer 505. An FEC (Forward Error Correction) encoder 502 is a section for carrying out the error-correction encoding, and adds tag information to the inputted data so as to perform error-correction encoding process of the inputted data. A data transmitter 503 transmits the data to the leaf station. If necessary, the data transmitter 503 adds a header into the data subjected to the error-correction encoding process by the FEC encoder 502, and multiplies the data, before the transmission. A retransmission request packet receiver 504, which is retransmission request receiving means, receives the retransmission request packet from the leaf station and outputs the data part of the retransmission request packet to the retransmission request packet analyzer 505. The retransmission request packet analyzer 505, which is received data analyzing means, selects a packet that is to be transmitted, in accordance with the thus received data, and outputs the packet to the memory 501. It is necessary that the inputted data is stored in the memory 501 until the inputted data is ready for retransmission. The data stored in the memory 501 is deleted after the time when the inputted data is ready for retransmission.

Figure 9:
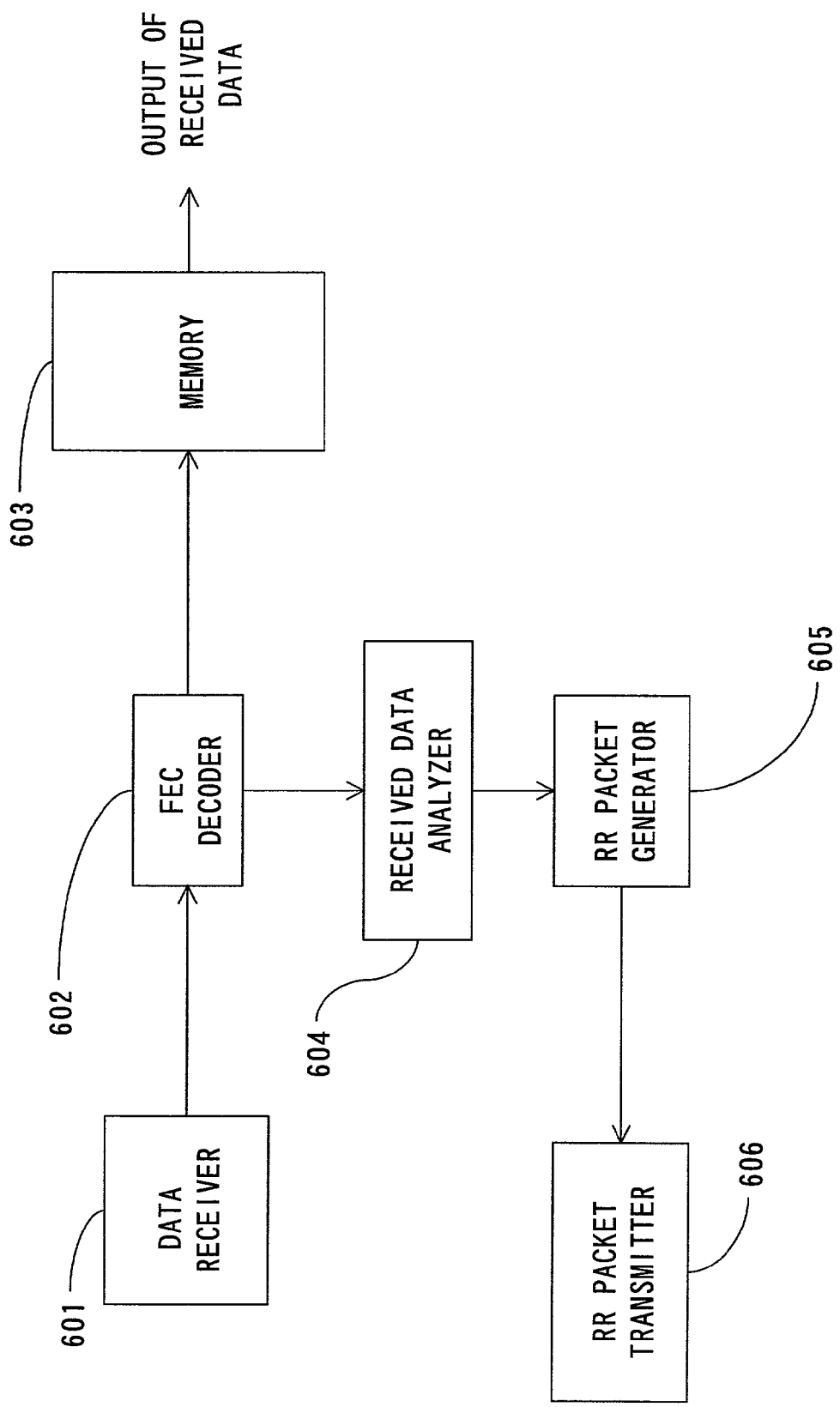
FIG. 9 is a block diagram illustrating an inner arrangement of the leaf station of the communications system of the communications method shown in FIG. 1.

FIG. 9 is a block diagram illustrating the leaf station used in the embodiments of the present invention. A data receiver 601 is data receiving means for receiving the data from the root station so as to output the data part of the data. An FEC decoder 602 performs FEC decoding process in which the data from the data receiver 601 is subjected to the FEC decoding. A data, which has been decoded correctly (normally), and its tag information are outputted to a memory 603, while an uncorrectable data and its tag information are outputted to a received data analyzer 604. The memory 603 is a memory apparatus for storing data including the correctly FEC decoded data and its tag information so as to output the data at a time for outputting the data. The received data analyzer 604 is a section for analyzing a block to be retransmitted in accordance with the result of the FEC decoding of the received data. Outputted to a retransmission request packet generator 605 is retransmission sequence information for the block that has been analyzed. The retransmission request packet generator 605 is means for generating a retransmission request packet in accordance with information of an uncorrectable block. In case no uncorrectable block is in the packet, the retransmission request packet generator 605 generates a packet (an empty retransmission request packet) for indicating that the receipt was completed normally. Moreover, it may be so arranged that an error-correction encoding process of, for example, an CRC (Cyclic Redundancy Check) code or the RS code, is performed when the packet is generated by the retransmission request packet generator 605. Here, the root station need have a section for detecting an error in the retransmission request packet and for decoding. A retransmission request packet transmitter 606 is a section for transmitting the retransmission request packet to the root station. It is necessary that the data written in the memory 603 is stored until the time when the data is outputted (data output time). Moreover, it is necessary to set the data output time is after the data is received as retransmission data.

Figure 10:
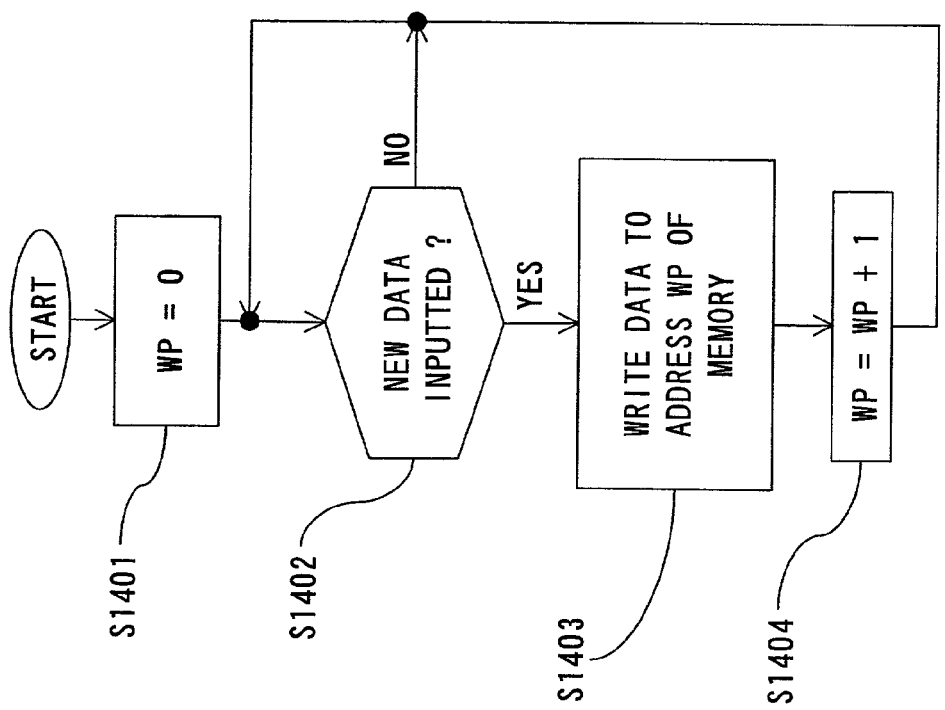
FIG. 10 is a flow chart for operation of a memory of the root station shown in FIG. 8.

FIG. 10 shows an example of a control flow chart of data writing process of the memory 501. To begin with, it is so initialized that WP=0 (S1401), where WP means a write address in the memory 501. Usually, the memory 501 is in a waiting state (S1402) for input of new data. When the new data is inputted, the inputted new data is written in the memory 501 (S1403). At this time, the inputted new data is written in an address indicated by WP. After the writing of the new data is completed, WP is incremented (S1404) so as to indicate a write address for a next data.

Figure 11:
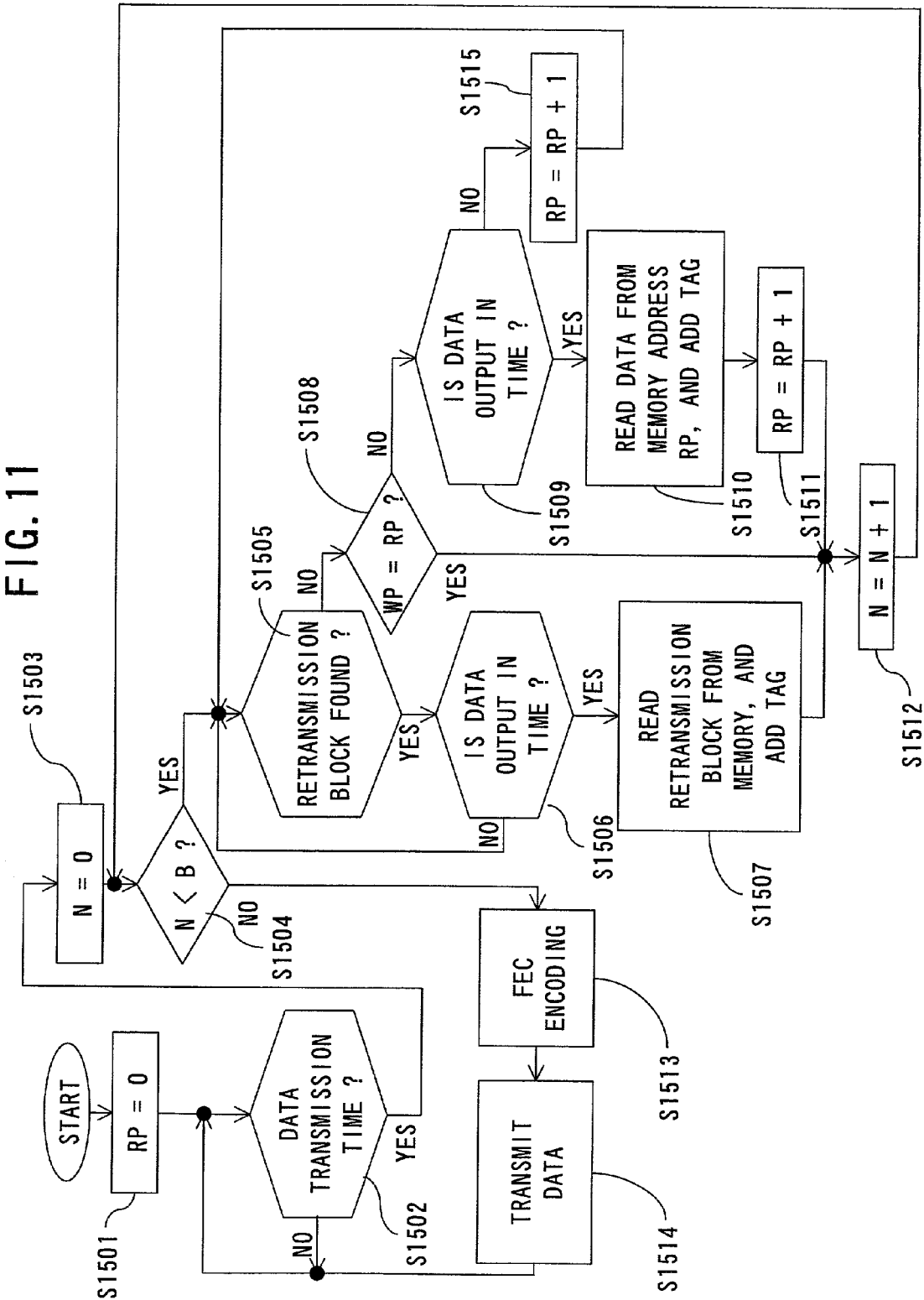
FIG. 11 is a flow chart for operation of the root station shown in FIG. 8.

FIG. 11 shows an example of a control flow chart of the memory 501, from reading out process to the data transmission. To begin with, it is so initialized that RP=0 (S1501), where RP indicates a reading-out address in the memory 501. Usually, the memory 501 is in a waiting state for the data transmission time (S1502). When the data transmission time comes, the data is read out from the memory 501 so as to generate the transmission data packet. At an initial stage of the generation of the transmission data packet, N=0 (S1503). While the N is incremented (S1512), blocks of a B number are read out. Here, N is a variable to show a number of blocks that have been read out so far.

Moreover, B shows how many error correction blocks can be transmitted in a packet. In the step S1504, N is compared with B. When N becomes equal to B, it is indicated that blocks of the B number have been read out already, so that one packet is generated with the blocks in the B number that have been read out and is subjected to the error-correction encoding (S1513). Then, the packet is transmitted (S1514). Thereafter, it goes back to the waiting state for a next data transmission time (S1502).

When N<B, it is indicated that blocks less than the B number have been read out, and it is necessary to further read out data from the memory 501 in order to prepare a packet. In this case, it is checked whether there is a block, which has not been transmitted, among the blocks requested to be retransmitted by the leaf station (S1505). If the leaf station requests the retransmission of the block, and the block has not been retransmitted, the data output time of the block that is requested to be retransmitted is compared with the correct time (S1506). When the data can be in time for the output time of the leaf station, the retransmission request block is read out from the memory 501, and tag information is added in the retransmission request block (S1507). Then, N is incremented (S1512), and it goes back to the step S1504. If the data cannot be in time for the output time of the leaf station, no retransmission is performed.

In this case, the block is deleted, and it goes back to Step S1505, so as to read out a next block. In case there is no retransmission request from the leaf station, or the retransmission has been done in response to the retransmission request, WP and RP are compared with each other, so as to transmit a new data (S1508).

Here, WP, which is identically shown in FIG. 10, indicates a write address in the memory 501. If WP=RP, it is indicated that there is no new data to be transmitted. In this case, no further transmission may be performed, or a data indicated by RP may be retransmitted. In both the cases, N is incremented (S1512), and it goes back to the step S1504. If WP and RP are not equal to each other in the step S1508, it is judged that the data indicated by RP has not been transmitted.

In this case, the output time of the data is compared with the current time (S1509). If the data is in time for the output time of the leaf station, the data is read out from the memory 501, and the tag information is added to the data (S1510). Then, RP is incremented (S1511), and N is incremented (S1512). Thereafter, it goes back to the step S1504. If the data is not in time for the output time, the transmission of the block is not performed. In this case, RP is incremented (S1515), it goes back to the step 1505, so as to read out a next block.

Figure 12:
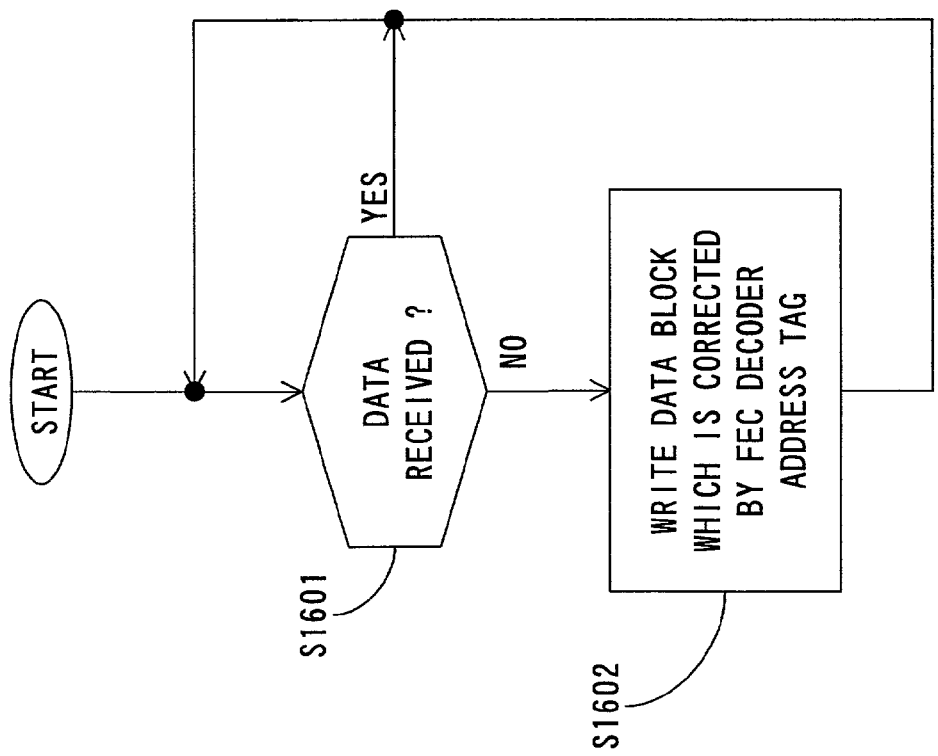
FIG. 12 is a flow chart for operation of the leaf station shown in FIG. 9.

FIG. 12 is an example of a control flow chart from the data reception to the process of writing a data into memory 603. Usually, the memory 603 is in a waiting state for data reception (S1601). When data is received, the data is subjected to the error-correction decoding, and only the data of the block that has been correctly decoded is written in the memory 603 (S1602). At this time, in the memory 603, the data is written into the address indicated by the tag information attached to each data block.

Figure 13:
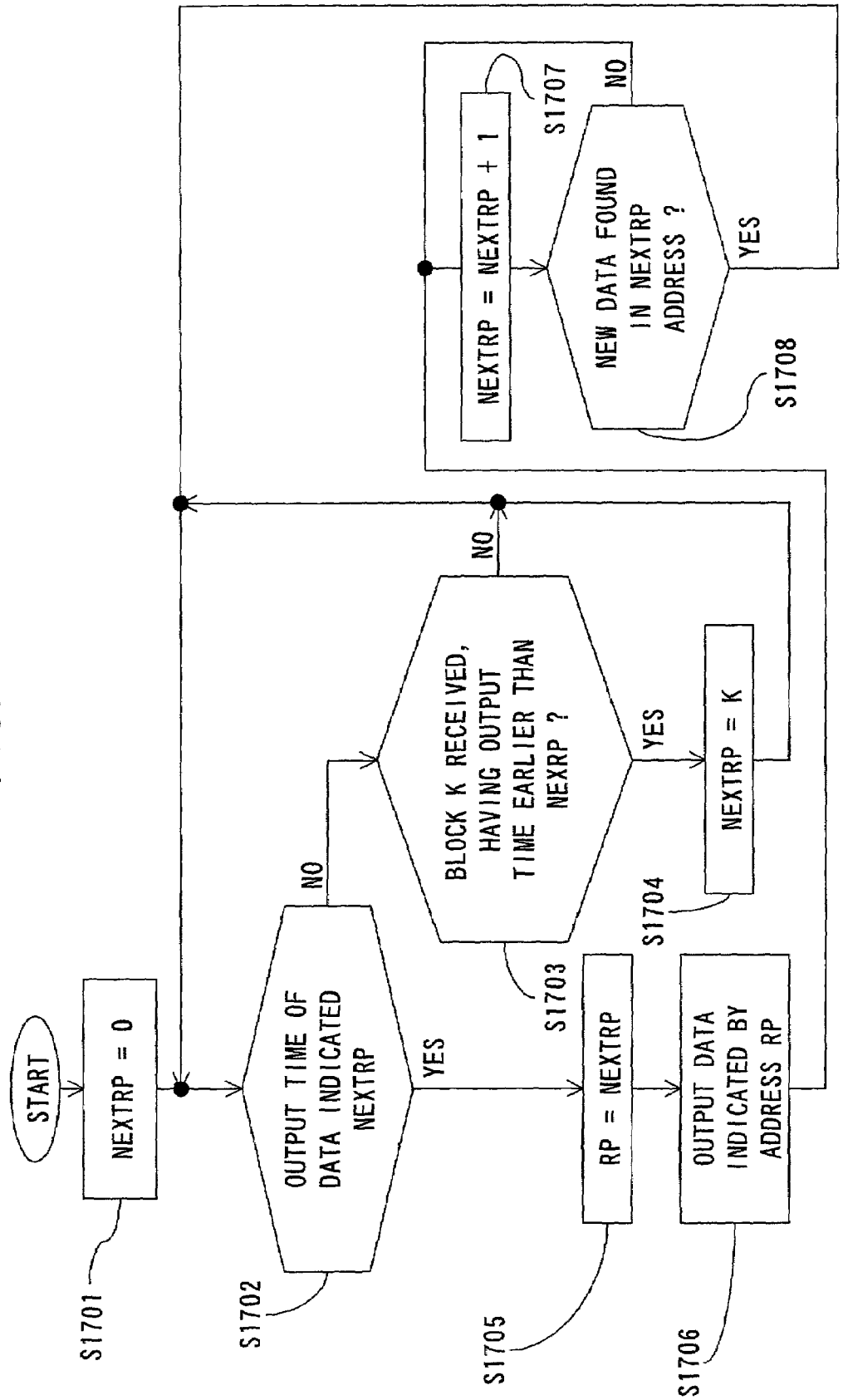
FIG. 13 is a flow chart for operation of the leaf station shown in FIG. 9.

FIG. 13 is an example of the flow chart of the data reading out process of the memory 603. In an initial stage, NEXTRP=0 (S1701), where RP indicates a reading-out address in the memory 603 of the data that has been outputted just before, while NEXTRP indicates a reading-out address of a data to be outputted next. Usually, the memory 603 is in a waiting state for data transmission time (S1702).

Here, in case received is a data block of a time earlier than an output time of a data block indicated by NEXTRP (S1703), NEXTRP is renewed in accordance with the address of the received block (S1704). At the output time of the data block indicated by NEXTRP, a value of NEXTRP is substituted in RP (S1705), a data block indicated by RP is read out from the memory 603 and is outputted (S1706).

Then, while NEXTRP is incremented, an address of a data to be outputted next is searched (S1707, S1708). In case the data to be outputted next is found out, thereby the search being completed, it goes back to the step S1702.

[Second Embodiment]

While in the first embodiment (shown in FIG. 1), the retransmission block is added at the head of the data block. However, there is a case where the retransmission block cannot be added at the head of the data packet due to a time to analyze the information of the retransmission request packet. In this case, a transmission data packet may be constructed by inserting the retransmission block between the head and a tail of the transmission data packet.

Figure 14:
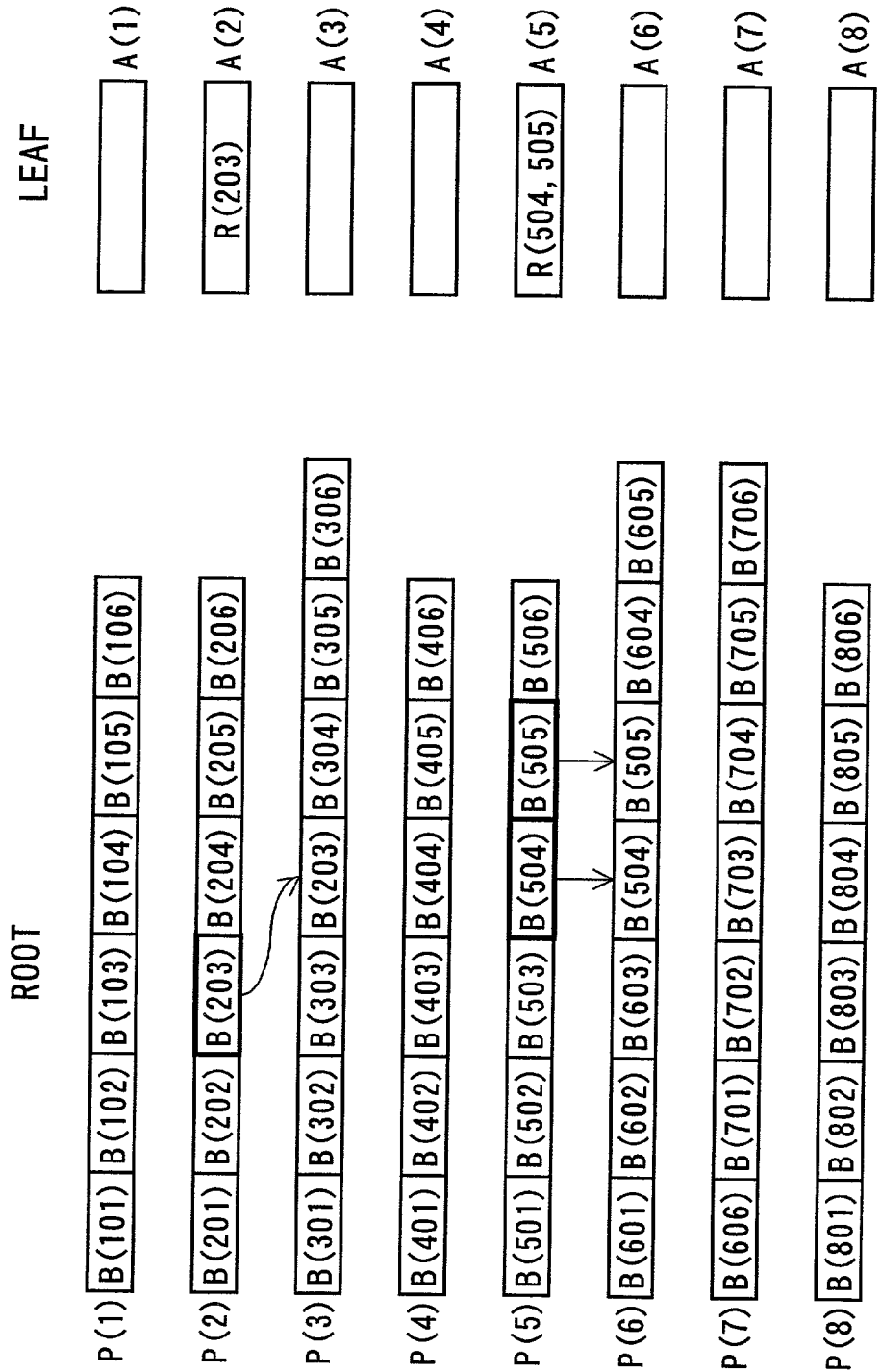
FIG. 14 is an explanatory view illustrating retransmission control of a communications method in accordance with another embodiment of the present invention.

In FIG. 14, shown is an embodiment in which this method is employed. In transmission data packets P(3) and P(6), retransmission blocks B(203), B(504) and B(505), which are to be added, are inserted in a fourth block of the transmission data packets, respectively.

[Third Embodiment]

In the first and the second embodiments, explained are cases where the data packet has a fixed number of the blocks. In the following, in a present embodiment, discussed is an embodiment where the data packet has a variable number of the blocks.

Figure 15:
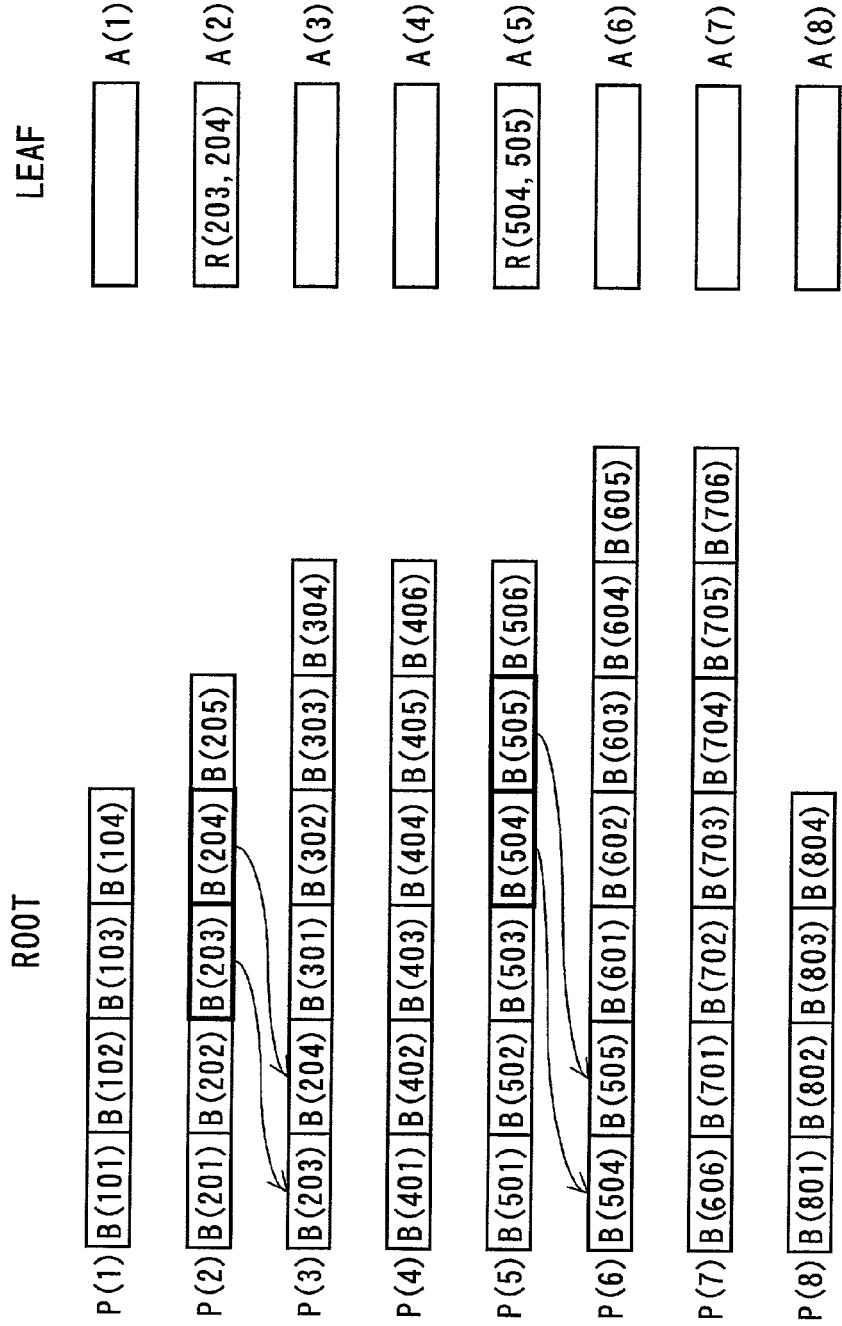
FIG. 15 is an explanatory view showing retransmission control of a communications method of still another embodiment of the present invention.

In FIG. 15, illustrated is an embodiment of the present invention where the data has a variable length. In FIG. 15, for the sake of simplification, the parts other than the data, such as the physical layer header, is not illustrated here. However, in reality, all of transmission data packets P(1) to P(8), and retransmission request packets A(1) through A(8), includes the physical layer preamble and the header. Moreover, the data packet need include information that indicates a packet length, in order to deal with the data packet that has a variable length.

A root station transmits the transmission data packet P(1) to a leaf station. The transmission data packet P(1) is composed of four blocks, namely blocks B(101), B(102), B(103), B(104). Here, it is illustrated that the transmission data packet P(1) is received and is subjected to forward error correction process by the leaf station, and the reception of the transmission data packet P(1) is judged as normal. In this case, an empty retransmission request packet A(1) is transmitted so as to inform that the reception has been normally carried out. The root station is informed by receiving the empty retransmission request packet A(1) that the transmission data packet P(1) is normally received. Therefore, the root station transmits the transmission data packet P(2) in a next cycle.

Further, it is illustrated that a transmission data packet P(2) is received and is subjected to the error correction by the leaf station. In this case, it is judged that blocks B(203) and B(204), which are respectively third and fourth blocks, are uncorrectable. In this case, a retransmission request packet A(2) including retransmission requests for the blocks B(203) and B(204) is transmitted. The root station adds, in a transmission data packet P(3), the blocks B(203) and B(204) before blocks B(301) to B(304), which are to be transmitted in this cycle, so that six blocks in total constitute one transmission data packet and are the transmission is carried out.

In the same fashion, the leaf station transmits retransmission request packets A(3) and A(4), and the root station transmits transmission data packets P(4) and P(5). It is illustrated that the transmission data packet P(5) is received by the leaf station and is subjected to the error correction. In this case, it is illustrated that blocks B(504) and B(505) are judged as uncorrectable, as a result of the error correction.

Therefore, a retransmission request packet A(5) that includes the blocks B(504) and B(505) is transmitted. The root station prepares a transmission data packet P(6) with seven blocks, namely the blocks B(504) and B(505), and blocks B(601) to B(605).

Here, six blocks, namely B (601) to B (606), are supposed to be transmitted in this cycle. However, because the retransmission request from the leaf station has priority, the block B(606) is not transmitted in this cycle. The block B(606) is inserted in a transmission data packet P(7), and is transmitted. Therefore, the transmission data packet P(7) is composed of seven blocks, namely, the block B(606), and blocks B(701) to B(706).

In case the transmission data is a dynamic image data, the dynamic image data need be reproduced in a stepwise manner at the receiving end. Therefore, it is necessary that the dynamic image data arrives at the receiving end within a predetermined period (dynamic image reproduction time).

When the dynamic image data is used in the present invention, it is possible to select a most suitable communications path by setting how many times the retransmission is carried out according how long the transmission delay time of the dynamic image data is allowed to be.

[Fourth Embodiment]

Figure 16:
FIG. 16 is an explanatory view illustrating retransmission control of a communications method of yet another embodiment of the present invention.

FIG. 16 shows an embodiment of the present invention, where a packet to be transmitted by a leaf station includes tag information of a block that has been received most recently.

A root station transmits a transmission data packet P(1), which is composed of blocks B(101) through B(106). In FIG. 16, the transmission data packet P(1) is normally received by a leaf station. In this case, the leaf station transmits a retransmission request packet A(1) that includes tag information, which says "B(106)", of the block that has been most recently received.

Here, the tag information of the block, which has been most recently received, indicates tag information of a block that has a latest output time, among the blocks that have been normally received by the leaf station. In case of the present embodiment, the tag information is given to the block B(101) through B(106) in this order. Therefore, in this case, the tag information, which says "B(106)", is the tag information of the block that has been most recently received.

Next, the root station transmits a transmission data packet P(2), which is composed of blocks B(201) to B(206). In FIG. 16, the transmission data packet P(2) is subjected to error correction in the leaf station, and is judged that the block B(203) is uncorrectable. In this case, a retransmission request packet A(2), which includes a retransmission request for the block B(203) and the tag information, which says "B(206)", of the block that has been most recently received, is transmitted to the root station.

The root station prepares a transmission data packet P(3), in accordance with information in the retransmission request A(2). Thus, while including the block B(203) at its head, the transmission data packet P(3) includes the block B(203) and blocks B(301) through B(306).

In FIG. 16, illustrated next is a case where the blocks B(305) and B(306) in the transmission data packet P(3) are uncorrectable, or the blocks B(305) and B(306) are not received by the leaf station. Because the leaf station cannot receive the blocks B(305) and B(306) normally, the leaf station cannot make a retransmission request for the blocks B(305) and B(306). Thus, the leaf station transmits to the root station a retransmission request packet A(3) that includes tag information, which says "B(304)" of the block that has been most recently received. The root station finds out that the block B(305) and B(306) were not normally received, because, it the retransmission request packet A(3), the tag information of the block that has been most recently received indicates "B(304)" while the transmission data packet P(3) is transmitted including the blocks up to B(306). Therefore, the root station retransmits the blocks B(305) and B(306). Thus, a transmission data packet P(4) is prepared with the blocks B(305) and B(306) and blocks B(401) through B(405), and is transmitted to the leaf station. The leaf station receives the transmission data packet P(4) normally, and transmits a retransmission request packet A(4) including tag information, which says "B(405)", of a block that has been received most recently.

In the same fashion, the root station prepares transmission data packets P(5) to P(8) in accordance with the information from the leaf station, and transmits the transmission data packets P(5) to P(8), while the leaf station prepares retransmission request packets A(5) to A(8) in accordance with reception state and error correction state, and transmits the retransmission request packets A(5) to A(8).

Figure 17:
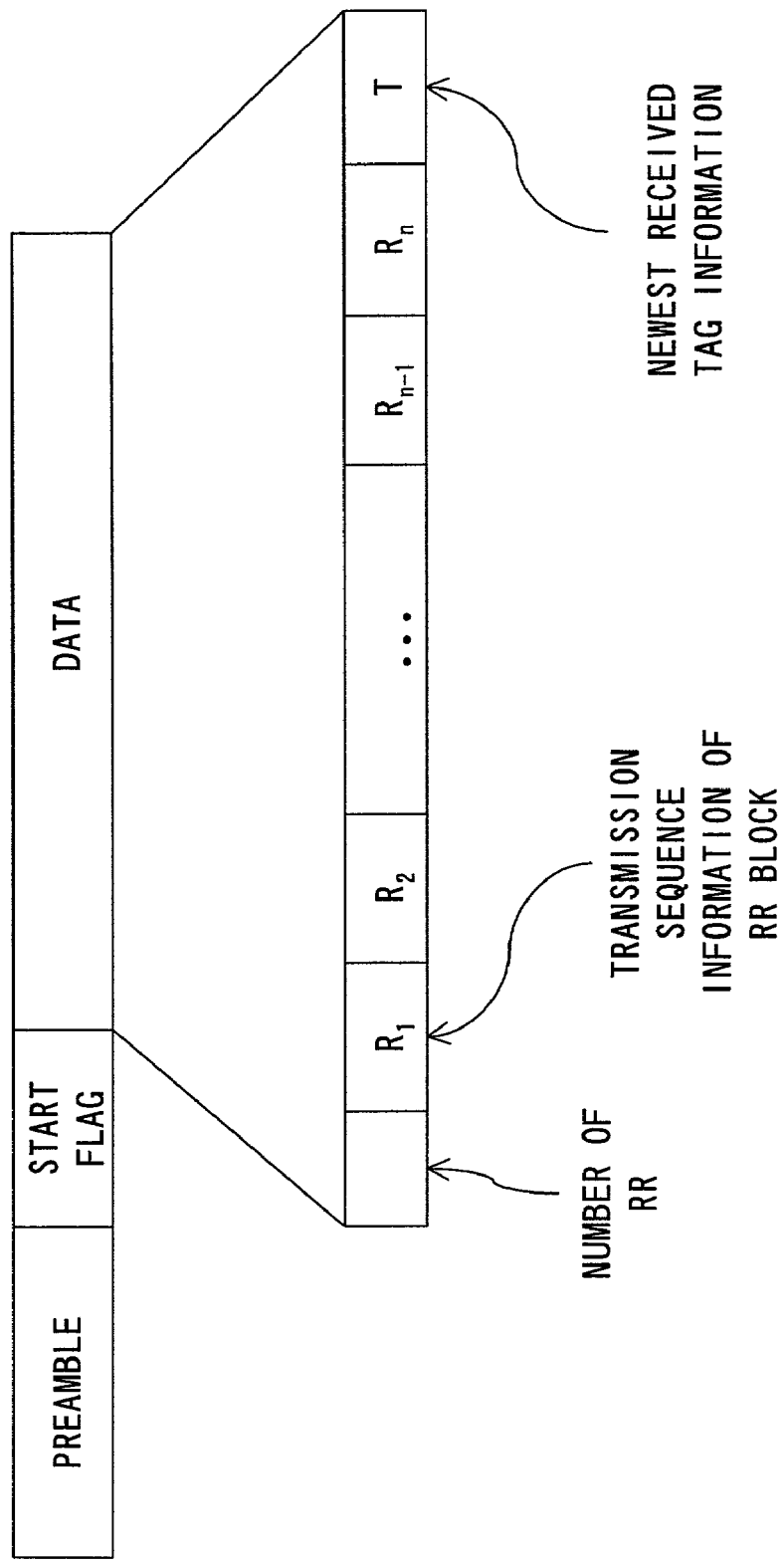
FIG. 17 is an explanatory view illustrating an example of a packet format of retransmission request packet in accordance with the communications method shown in FIG. 16.

FIG. 17 shows an example of a packet format of the retransmission request packet, which is transmitted by the leaf station, for use in the present embodiment.

As shown in FIG. 17, a physical preamble and a start flag locate at the head of the retransmission request packet. A data part is divided into a retransmission request block number, retransmission sequence information, and a newest received tag information. The retransmission request block number indicates how many retransmission block is required by the packet. The retransmission sequence information R1 to Rn indicate respectively an identifier of each block that is requested to be retransmitted. The newest received tag information T indicates the identifier of the most recent data, among the data received from the root station.

As explained above, with the present embodiment, a side in which the root station locates can perform the retransmission of the transmission data packet, even if a side, where the leaf station locates, receives only part of the transmission data packet, normally. Thus, it is possible to perform the retransmission efficiently.

[Fifth Embodiment]

Figure 18:
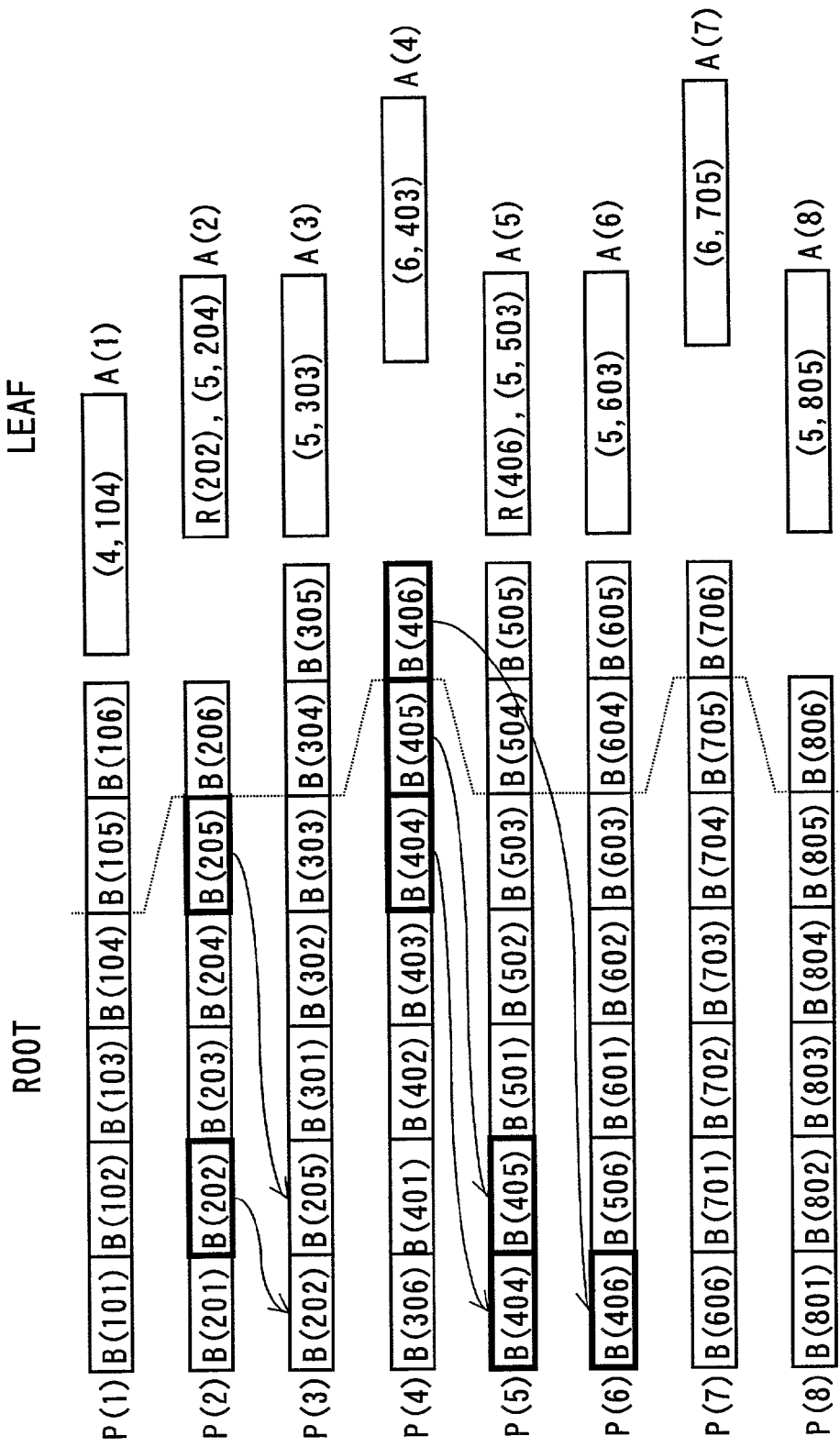
FIG. 18 is an explanatory view showing retransmission control of a communications method of yet still another embodiment of the present invention.

In FIG. 18, illustrated is an embodiment where a retransmission request packet, which is to be transmitted from the leaf station, includes tag information of a block that has been most recently received, and information how many blocks have been error-correction decoded in a particular cycle.

A root station transmits a transmission data packet p(1) that is composed of blocks B(101) to B (106). In FIG. 18, illustrated is an example where the leaf station receives normally the transmission data packet P(1). Moreover, in the example, the error-correction decoding process is finished only for the four blocks, namely B(101) to B(104), before a time when the leaf station transmits a transmission request packet. In this case, the leaf station transmits a retransmission request packet A(1) that includes a number of the error-correction decoded blocks, which is "4" here, and the tag information, which says "B(104)", of the block that has been most recently received.

Here, the tag information of the block that has been most recently received indicates tag information of a block that is most lately outputted, among the blocks that have been normally received. In case of FIG. 18, the tag information is given to the respective blocks B(101) to B(104) in this order. Thus, in this case, the tag information of the block that has been most recently received says "B(104)".

Next, the root station transmits a transmission data packet P(2) that is composed of blocks B(201) to B(206). In FIG. 18, it is illustrated that it is judged by the leaf station that the block B(202) and B(205) are uncorrectable, as a result of the error correction of the transmission data packet P(2). Moreover, the error-correction decoding process for the block B(206) has not completed yet at the packet transmission time of the leaf station. Therefore, even though the block B(205) is uncorrectable, the retransmission request of the block B(205) cannot be performed, because the leaf station is not informed of tag information of the block B(205). Here, the leaf station transmits a retransmission request packet A(2) that includes a retransmission request for the block B(202), a number of the error-correction decoded blocks, which is "5" here, and the tag information, which says "B(204)", of the block that has been most recently received.

Next, the root station prepares a transmission data packet P(3) with the blocks B(202) and B(205), and blocks B(301) to B(305), in accordance with information of the retransmission request packet A(2). In the transmission data packet P(3), the blocks B(202) and B(205) are at a head of the transmission data packet p(3). The block B(202) is retransmitted because the information from the leaf station includes the retransmission request for the block B(202). Moreover, because the leaf station gives the number of the error-correction decoded blocks "5" and the tag information "B(204)" of the block that has been most recently received, it is found out that the block B(205) was not normally received. Therefore, the block B(205) is also retransmitted. Here, illustrated in FIG. 18 is an example where the leaf station normally receives the transmission data packet P(3). In this case, transmitted is a retransmission request packet A(3) that includes a number of the error-correction decoded blocks "5", and the tag information "B(303)" of the block that has been most recently received.

Next, the root station transmits a transmission data packet P(4) that is composed of a block B(306), and blocks B(401) to B(406). In FIG. 18, illustrated is an example where the blocks B(404) to B(406) are uncorrectable for the leaf station. Moreover, the error-correction decoding process of the six blocks has been completed before the packet transmission time of the leaf station. Therefore, transmitted is a retransmission request packet A(4) that includes a number of the error-correction decoded blocks "6", and tag information "B(403)" of a block that has been most recently received.

Next, the root station prepares a transmission data packet P(5) with the blocks B(404) and B(405), and blocks B(501) to B(505), in accordance with information in the retransmission request packet A(4). In the transmission data packet P(5), the blocks B(404) and B(405) are added at a head of the transmission data packet P(5). Because the number of the error-correction decoded blocks "6", and the tag information "B(403)" of the block that has been most recently received, it is found out that the blocks B(404) and B(405) were not normally received. Therefore, the blocks B(404) and B(405) are retransmitted. FIG. 18 shows an example where the leaf station receives a transmission data packet P(5), normally. However, because the block B(406) is uncorrectable in the cycle just before, and the block B(406) has not been transmitted, the leaf station transmits a retransmission request packet A(5) that includes a retransmission request for the block B(406), a number of the error-correction decoded blocks "5", and tag information "B(503)" of a block that has been most recently received.

In the same manner, the root station prepares transmission data packets P(6) to P(8), in accordance with the information from the leaf station, and transmits the transmission data packets P(6) to P(8), while the leaf station prepares retransmission request packets A(6) to A(8), in accordance with the reception state and the error correction state, and transmits the retransmission request packets A(6) to A(8).

In addition, with the fifth embodiment of the present invention, it is possible to perform an efficient retransmission, even if the error-correction decoding process of the received data block has not been completed before the data transmission time of the leaf station.

As discussed above, a communications method of the present invention, which uses a data packet composed of a plurality of error correction blocks of error correction codes of a block type, may be so arranged that retransmission per error correction block is carried out by transmitting an error correction status of each error correction block from a receiving end to a transmitting end.

Therefore, with the above communications method, it is possible to eliminate unnecessary use of bands, while it is also possible to attain a low bit error rate.

Moreover, in the respective embodiments, the retransmission is carried out only once. However, it is possible to increase a number of times of the retransmission by altering the process of the retransmission request packet generator 605 and the retransmission request packet analyzer 505. The process of the retransmission request packet generator 605 and the retransmission request packet analyzer 505 can be altered by changing memory capacity (size) of the memories 501 and 603, which are respectively located in the root station and the leaf station. Therefore, it is possible to select a most suitable path, considering how important a transmission data is, and delay of the transmission.

Moreover, in general, it is difficult to attain communication with the low bit error rate, when the communication is carried out by using a radio wave, for example, due to fading. However, with the above communications method, it is possible to attain the low bit error rate while a decrease in a transmission rate can be limited.

Furthermore, with the above communications method, the number of times of the retransmission can be adjusted while a decrease in the transmission rate is limited, even in case where carried out is a real-time transmission of a dynamic image, or the like. Therefore, it is possible to perform the communication in high quality.

Moreover, with the above communications method, it is possible to perform the retransmission with a higher reliability, because the retransmission request packet is subjected to the error-detection encoding and the error-correction encoding. In addition, any code may be selected accordingly, for the error detection code and the error correction code, provided that the code can be dealt with per block.

The communications method of the present invention, in addition to the above communications method, may be so arranged that the error correction state of each error correction block includes identifier information of a block of latest output time among blocks received by the receiving end.

The communications method of the present invention, in addition to the above communications method, may be so arranged that the error correction state of each error correction block further includes identifier information of a block of latest output time among blocks received by the receiving end, and a number of blocks that have been finished being error-correction decoded.

The communications apparatus of the present invention, which receives a data packet composed of a plurality of blocks, may be so arranged that only a block that is undecodable is selected out of the received data packet so as to perform retransmission request.

The communications apparatus of the present invention, which receives a data packet composed of a plurality of blocks of error correction codes of a block type, may be so arranged that only a block that is undecodable is selected out of the received data packet so as to perform retransmission request.

Furthermore, the communications apparatus of the present invention may be so arranged that the retransmission request is composed of a data packet that includes an error detection code and/or an error correction code. In addition, any code may be selected accordingly, for the error detection code and the error correction code, provided that the code can be dealt with per block.

The communications apparatus of the present invention may be so arranged that the retransmission request is composed of the data packet which further includes a error detection code and/or an error correction code in information that indicates how many blocks are required to be retransmitted.

The communications apparatus of the present invention may be so arranged that the retransmission request further includes in a data packet the pieces of information that indicates how many blocks are required to be retransmitted.

The communications apparatus of the present invention may be so arranged that, in the communications apparatus, the retransmission request further includes an identifier of a block of the latest output time in the received data packet.

The communications apparatus of the present invention may be so arranged that, in the communications apparatus, the retransmission request further includes (1) an identifier of a block of the latest output time in the received data packet, and (2) information that indicates how many blocks are required to be retransmitted.

The communications apparatus of the present invention, which transmits a data packet composed of a plurality of blocks so as to communicate, may have such an arrangement that, if a retransmission request for a undecodable block is received, the block of the retransmission request is added to blocks that constitute a data packet to be transmitted next or later (a following data packet), and is transmitted.

The communications apparatus of the present invention, which transmits a data packet composed of a plurality of blocks of error correction codes of a block type so as to communicate, may have such an arrangement that, if a retransmission request for a undecodable block is received, the block of the retransmission request is added to blocks that constitute a data packet to be transmitted next or later, and is transmitted.

In addition to the above communications apparatus, the communications apparatus of the present invention may be so arranged that the block, which has been requested by the retransmission request, is added at a head of the following data packet.

In addition to the above communications apparatus, the communications apparatus of the present invention may be so arranged that the block, which has been requested by the retransmission request, is added between a head and a tail of the following data packet.

In addition to the above communications apparatus, the communications apparatus of the present invention may be so arranged that the block, which has been requested by the retransmission request, is added at a tail of the following data packet.

Furthermore, the communications apparatus of the present invention may be so arranged that the data packet has a fixed number of the blocks.

Moreover, the communications apparatus of the present invention may be so arranged that the data packet has a variable number of the blocks.

The communications system of the present invention may be so arranged that a data packet receiving side transmits to a data packet transmitting side a retransmission request only for an undecodable block in a received data packet, so that the data packet transmitting side retransmits the undecodable block in response to the retransmission request.

In short, the communications system of the present invention may be so arranged that a transmitting end is provided with (1) means for carrying out error-correction encoding process of a data, and (2) means for generating a suitable packet in accordance with a retransmission request from a receiving end and for transmitting the packet to a receiving end, while the receiving end is provided with (a) means for carrying out error-correction decoding of the received data, (b) means for distinguishing uncorrectable block in accordance with a result of the error-correction decoding, and (c) means for transmitting a retransmission request packet to the transmitting end.

Therefore, with the above communications system, in case where one packet is composed of a plurality of correction blocks of the error correction codes of a block type, if a block in the packet is judged as uncorrectable by the receiving end, it is possible to retransmit only the block that is required to be retransmitted, instead of the retransmission of the whole packet.

Here, it is also possible to prepare a packet by adding the error detection code and/or the error correction code to the transmission sequence information and the retransmission information of each block in the transmission data packet.

Moreover, the packet may be prepared in such a manner that transmission sequence information and/or retransmission information is included in each block of the data packet.

Furthermore, both the transmitting end and the receiving end may be provided with data transmitting means and data receiving means which use a radio wave.

Moreover, the present invention is more effective when the data to be transmitted is the real-time data.

Moreover, it is preferable that the communications apparatus is provided with retransmitting means for retransmitting all blocks contained in a data packet that has been transmitted just before, if no retransmission request is received, where it is set that the receiving end returns, upon receipt of the data packet, a signal to the transmitting end so as to inform that the data packet is received.

Furthermore, it is preferable that the communications apparatus is provided with transmitting means for transmitting a following data block to be transmitted next when no retransmission request is received in a predetermined period, where it is not set that the receiving end returns, upon receipt of the data packet, a signal to the transmitting end so as to inform the data packet is received.

Further, the communications apparatus may be provided with transmitting means for transmitting the retransmission request packet, in case the receiving end receives no data from the transmitting end for a predetermined period where the data packet is transmitted periodically.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A communications method for a communication system having a transmitting end and receiving end, in which a payload of a data packet is composed of a plurality of error correction blocks, each error correction block having a block-type error correction code, comprising the steps of:

performing error correction decoding for each of said plurality of error correction blocks in said data packet at a receiving end;

transmitting an error correction state of each of said error correction blocks from said receiving end to a transmitting end; and extending the size of the payload of a packet to be transmitted next or subsequently from the transmitting end by adding an error correction block, a retransmission of which has been requested, to the error correction blocks in the data packet to be transmitted next or subsequently, thereby increasing the number of error correction blocks in the data packet to be transmitted next or subsequently.

2. The communications method as set forth in claim 1, wherein:

the data packet contains a retransmission-block field where the block, a retransmission of which has been requested, is added, the field being not used in an ordinary state where there is no retransmission request; and if a retransmission of more blocks than the retransmission-block field has been requested, some blocks to be transmitted in the data packet to which are added the blocks, a retransmission of which has been requested, are added to a subsequent data packet for transmission using the retransmission-block fields.

3. The communications method as set forth in claim 1, wherein said error correction state of each error correction block includes identification information of a block that is most lately outputted from said transmitting end, among blocks received by said receiving end.

4. The communications method as set forth in claim 1, wherein said error correction state of each error correction block includes identification information of a block last outputted from said transmitting end, among blocks received by said receiving end and a number of blocks for which error-correction decoding has finished.

5. A communications apparatus, which transmits a data packet, a payload for the data packet is composed of a plurality of blocks, so as to communicate, comprising:

a receiver end performing error correction decoding for each of said plurality of blocks received from a transmitter end;

said transmitter end, when having received a request for a retransmission of an undecodable block from said receiver end, extending the size of the payload of the data packet to be transmitted next or subsequently from the transmitter end by adding the block, a retransmission of which has been requested, to the blocks constituting the data packet to be transmitted next or subsequently, thereby increasing the number of blocks in the data packet to be transmitted next or subsequently.

6. The communications apparatus as set forth in claim 5, wherein:

the data packet contains a retransmission-block field where the block, a retransmission of which has been requested, is added, the field being not used in an ordinary state where there is no retransmission request; and if a retransmission of more blocks than the retransmission-block field has been requested, some blocks to be transmitted in the data packet to which are added the blocks, a retransmission of which has been requested, are added to a subsequent data packet for transmission using the retransmission-block fields.

7. The communications apparatus as set forth in claim 5, wherein the block, a retransmission of which has been requested, is added at a head of the data packet to be transmitted next or subsequently.

8. The communications apparatus as set forth in claim 5, wherein the block, a retransmission of which has been requested, is added between a head and a tail of the data packet to be transmitted next or subsequently.

9. The communications apparatus as set forth in claim 5, wherein the block, a retransmission of which has been requested, is added at a tail of the data packet to be transmitted next or subsequently.

10. The communications apparatus as set forth in claim 5, wherein the data packet has a fixed number of blocks.

11. The communications apparatus as set forth in claim 5, wherein the data packet has a variable number of blocks.

12. A communications apparatus, which transmits a data packet, a payload of the data packet is composed of a plurality of blocks, each block having a block-type error correction code so as to communicate, comprising:
   a receiver end performing error correction decoding for each of said plurality of blocks received from a transmitter end;
   said transmitter end, when having received a request for a retransmission of an undecodable block from said receiver end, extending the size of the payload of the data packet to be transmitted next or subsequently from the transmitter end by adding the block, a retransmission of which has been requested, to the blocks constituting the data packet to be transmitted next or subsequently, thereby increasing the number of blocks in the data packet to be transmitted next or subsequently.

13. The communications apparatus as set forth in claim 12, wherein:
   the data packet contains a retransmission-block field where the block, a retransmission of which has been requested, is added, the field being not used in an ordinary state where there is no retransmission request; and
   if a retransmission of more blocks than the retransmission-block field has been requested, some blocks to be transmitted in the data packet to which are added the blocks, a retransmission of which has been requested, are added to a subsequent data packet for transmission using the retransmission-block field.

14. The communications apparatus as set forth in claim 12, wherein the block, a retransmission of which has been requested, is added at a head of the data packet to be transmitted next or subsequently.

15. The communications apparatus as set forth in claim 12, wherein the block, a retransmission of which has been requested, is added between a head and a tail of the data packet to be transmitted next or subsequently.

16. The communications apparatus as set forth in claim 12, wherein the block, a retransmission of which has been requested, is added at a tail of the data packet to be transmitted next or subsequently.

17. The communications apparatus as set forth in claim 12, wherein the data packet has a fixed number of blocks.

18. The communications apparatus as set forth in claim 12, wherein the data packet has a variable number of blocks.

19. A communications system, including: a communications apparatus which receives a data packet, a payload of the data packet is composed of a plurality of blocks, performs error correction decoding on said plurality of blocks, selects only an undecodable block out of said plurality of blocks, and transmits a request for a retransmission of the undecodable block; and another communications apparatus which transmits a data packet, a payload of the data packet is composed of a plurality of blocks and when having received a request for a retransmission of an undecodable block, extends the size of the payload of the data packet to be transmitted next or subsequently by adding the block, a retransmission of which has been requested, to the blocks constituting the data packet to be transmitted next or subsequently, thereby increasing a number of blocks in the data packet to be transmitted next or subsequently,
   a data packet receiving end transmits, to a data packet transmitting end, a request for a retransmission of only an undecodable block out of a data packet that has been received; and
   the data packet transmitting end, in response to the request for a retransmission, retransmits a corresponding block.

20. A communications system, including: a communications apparatus which receives a data packet, a payload of the data packet is composed of a plurality of blocks, performs error correction decoding on said plurality of blocks, selects only an undecodable block out of plurality of blocks that has been received, and transmits a request for a retransmission of the undecodable block; and another communications apparatus which transmits a data packet, a payload of the data packet is composed of a plurality of blocks of block-type error correction codes, and when having received a request for a retransmission of an undecodable block, extends the size of the payload of a data packet to be transmitted next of subsequently by adding the block, a retransmission of which has been requested, to the blocks constituting the data packet to be transmitted next or subsequently, thereby increasing the number of blocks in the data packet to be transmitted next or subsequently,
   a data packet receiving end transmits, to a data packet transmitting end, a request for a retransmission of only an undecodable block out of a data packet that has been received; and
   the data packet transmitting end, in response to the request for a retransmission, retransmits a corresponding block.

* * * * *